United States Patent [19]

Iwasa et al.

[11] Patent Number: 4,459,549
[45] Date of Patent: Jul. 10, 1984

[54] METHOD AND APPARATUS FOR TESTING MAGNETIC BUBBLE DEVICES BY VARYING THE COMPONENTS OF INPUT SIGNALS

[75] Inventors: Seiichi Iwasa; Yoshiya Kaneko, both of Kawasaki; Kengo Nogiwa, Inagi, all of Japan

[73] Assignee: Fujitsu Limited, Kawasaki, Japan

[21] Appl. No.: 461,969

[22] Filed: Jan. 28, 1983

Related U.S. Application Data

[63] Continuation of Ser. No. 137,961, Apr. 7, 1980, abandoned.

[30] Foreign Application Priority Data

Apr. 11, 1979 [JP] Japan .................................. 54/43963

[51] Int. Cl.³ ........................ G01R 33/12; G11C 7/00
[52] U.S. Cl. ................................... 324/210; 365/201
[58] Field of Search ...................... 324/210, 211, 212; 365/1, 15, 201

[56] References Cited

U.S. PATENT DOCUMENTS 3,460,109  8/1969  Veneziano .......................... 324/210
4,053,751 10/1977  Ault ..................................... 365/1
4,233,668 11/1980  Yamaguchi et al. ................ 324/210

OTHER PUBLICATIONS

Besset et al., "Bubble Memories Demand Unique Test Methods", Electronics, May 1979, pp. 117–122.
Brownstein, "Tester for Bubble Memories, First in Field", Apr. 1979, pp. 167–168.
Iwasa et al., "Testing and Defects of Bubble Memory Devices", J. Appl. Phys. 50(3), Mar. 1979, pp. 2231–2233.

Primary Examiner—Gerard R. Strecker
Assistant Examiner—Walter E. Snow
Attorney, Agent, or Firm—Staas & Halsey

[57] ABSTRACT

Disclosed herein is a method of testing a magnetic bubble device which guarantees allowable variation ranges for a variety of signal components of input signals applied to a magnetic bubble element when the magnetic bubble device is to be energized. A variety of signal components are varied in a testing cycle for writing, reading and collating information, whereby a plurality of combinations of the variety of signal components are obtained. The obtained input signals are continuously applied to the bubble element to effect the test.

14 Claims, 23 Drawing Figures

Fig. 4A
PRIOR ART
| TEST | GATE | PHASE | PULSE WIDTH | CURRENT VALUE |
|---|---|---|---|---|
| 1 | Gen | − | 0 | 0 |
|   | Ann | − | 0 | 0 |
|   | Rep | − | 0 | 0 |
|   | Tr in | − | 0 | 0 |
|   | Tr out | − | 0 | 0 |
| 2 | Gen | 0 | − | 0 |
|   | Ann | 0 | − | 0 |
|   | Rep | 0 | − | 0 |
|   | Tr in | 0 | − | 0 |
|   | Tr out | 0 | − | 0 |
| n ($3^3 = 27$) | Gen | + | + | + |
|   | Ann | + | + | + |
|   | Rep | + | + | + |
|   | Tr in | + | + | + |
|   | Tr out | + | + | + |
Fig. 4B
PRIOR ART
− 0 +
Fig. 4C
PRIOR ART
− 0 +
Fig. 4D
PRIOR ART

(a) 
min ←——→ max (b) 
min
max (c) 
max
min (d) 
max
max

METHOD AND APPARATUS FOR TESTING MAGNETIC BUBBLE DEVICES BY VARYING THE COMPONENTS OF INPUT SIGNALS

This is a continuation of application Ser. No. 137,961 filed Apr. 7, 1980, now abandoned.

FIELD OF THE INVENTION

The present invention relates to a testing method which guarantees allowable variation ranges for pulse currents which control various functional gates necessary for operating a magnetic bubble device as represented by a bubble memory. The invention also relates to a testing method which guarantees allowable variation ranges for a variety of signal components, such as driving magnetic fields and the like.

BACKGROUND OF THE INVENTION

To operate the bubble memory, current pulses of predetermined conditions must be fed to various electrically conductive patterns, such as a generator, an annihilator, a replicator, a transfer switch gate, and the like. Further, the operating regions of the biasing magnetic field for these current pulse conditions serve as important factors for expressing the operation characteristics of the bubble memory. For instance, the change in characteristics of a bubble memory relative to pulse current conditions applied to a generator is considered below. The pulse current will have phase characteristics, pulse width characteristics and current characteristics. If these characteristics exist independently of each other, the bubble element will properly operate within given ranges of phase, pulse width and current value of the pulse current.

In practice, however, the bubble element does not properly operate even when various signal components, such as phase, pulse width and current value, satisfy the above-mentioned ranges. Through experiments it has been learned that the characteristics do not exist independently of each other. For example, a pulse current is directly affected by the phase, biasing magnetic field and pulse width. Consequently, the variation ranges cannot be guaranteed if the characteristics are tested independently of each other. Although the above description has dealt with the characteristics of a pulse current applied to a generator, the same fact also holds true for other functional gates.

In testing the bubble memory, therefore, the operation cannot be completely guaranteed unless the allowable variation regions are guaranteed while taking the mutual effects into consideration.

For this purpose, as will be mentioned later in detail, an element must be tested in regard to whether or not it properly operates for a maximum value, a minimum value and a standard value of phase, pulse width and current value of a pulse current fed to all of the functional gates.

Combinations of these phases, pulse widths, current values and functional gates must be set in a digital manner while being controlled by an electronic computer, and must be tested successively and repeatedly.

Thus, if it is attempted to test the testing elements consisting of various functional gates, a tremendous number of combinations must be treated, requiring great periods of testing time. If the individual testing elements are measured with respect to only two or three points, then the operating conditions in the regions between such points cannot be guaranteed. Therefore, among the elements which have passed the above-mentioned time consuming test a significant number of elements turn out to be defective after they have been put into practical use. This is attributed to the fact that when particular values of the test elements are combined, the elements may properly operate under the condition of such a combination, but fail to properly operate under the conditions of other combinations. It can be empirically foreseen to some extent which combination of which values of the test elements is most likely to develop erroneous operation or, in other words, which combination provides the narrowest or the poorest operating margins. In practice, however, the design requirements and variance depending upon the lots, make it difficult to foresee desirable combinations. If the worst combinations are known, they could be taken into consideration in planning the test. With the worst combinations unforeseeable, however, there is no way to cope with the situation.

SUMMARY OF THE INVENTION

The object of the present invention is to eliminate the aforementioned defects of conventional testing methods.

Another object of the present invention is to provide a method which may be used to test a magnetic bubble device within very short periods of time by efficiently and very quickly combining every bubble memory test condition.

A further object of the present invention is to provide a method of testing a bubble device, which is capable of effecting complete testing without leaking any combination of test conditions, to contribute to the increase in the reliability of the products.

According to the present invention, there is provided a method of testing a magnetic bubble device to guarantee allowable variation ranges for a variety of signal components of input signals which are applied to a magnetic bubble element when the magnetic bubble device is to be actuated, wherein each of the variety of signal components is varied within a testing cycle for writing, reading and collating information, thereby to obtain a plurality of combinations of the variety of signal components. The obtained input signals are continuously applied to the magnetic bubble element to perform the test.

According to the present invention, there is further provided a method of testing a magnetic bubble device to guarantee allowable variation ranges for a variety of signal components of input signals which are applied to a magnetic bubble element when the magnetic bubble device is to be actuated. Means for setting the variety of signal components into a plurality of conditions independently of each other, and means for changing the combinations of the conditions responsive to input pulses are provided.

Further features and advantages of the present invention will become apparent from the ensuing description with reference to the accompanying drawings to which, however, the scope of the invention is in no way limited.

BRIEF DESCRIPTION OF THE DRAWINGS

FIGS. 4A, 4B, 4C and 4D are diagrams illustrating the outline for testing the bubble memory according to a conventional method;

Figure 7:
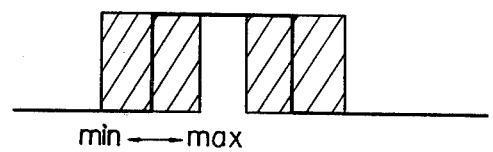
Figure 7:
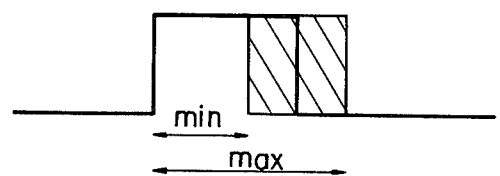
Figure 7:
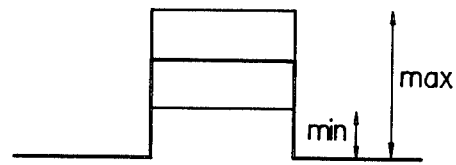
Figure 7:
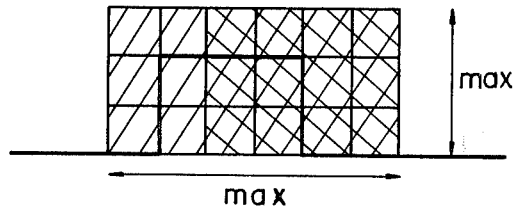
Figure 8A:
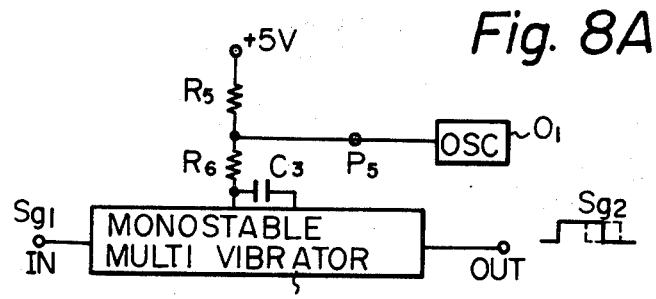
Figure 8B:
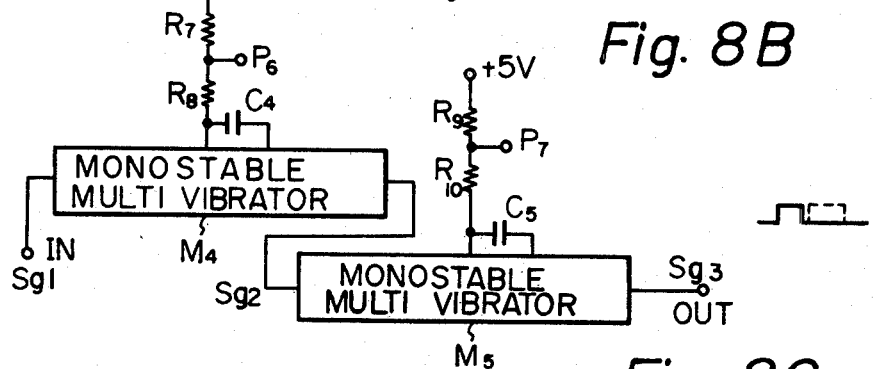
Figure 8C:
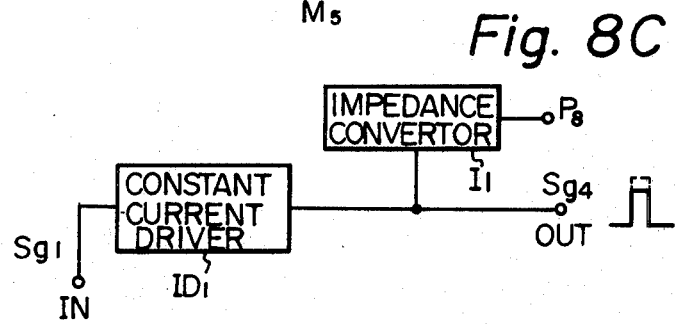
Figure 8D:
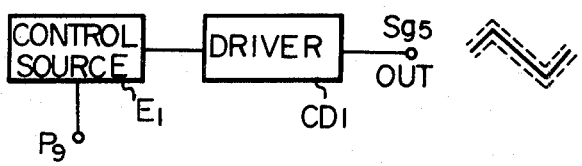
Figure 8E:
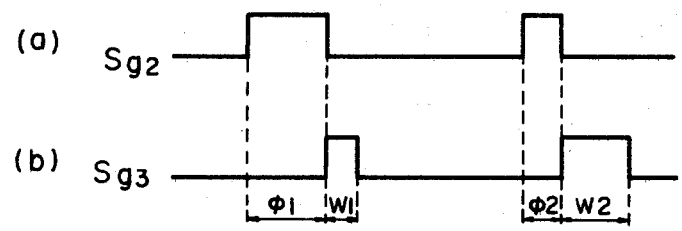
Figure 9A:
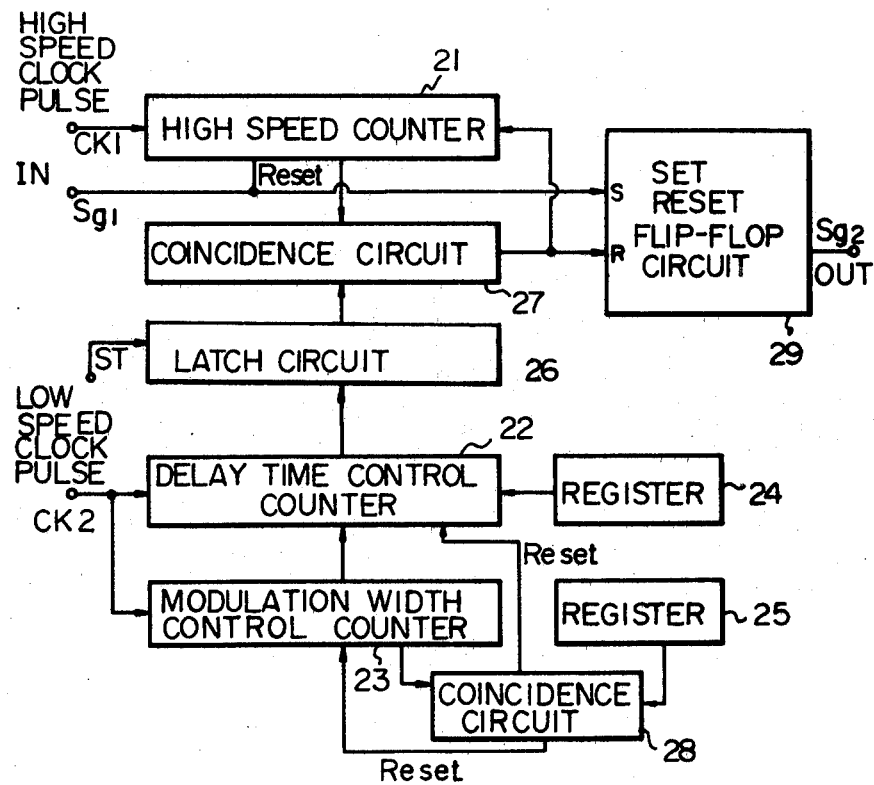
Figure 9B:
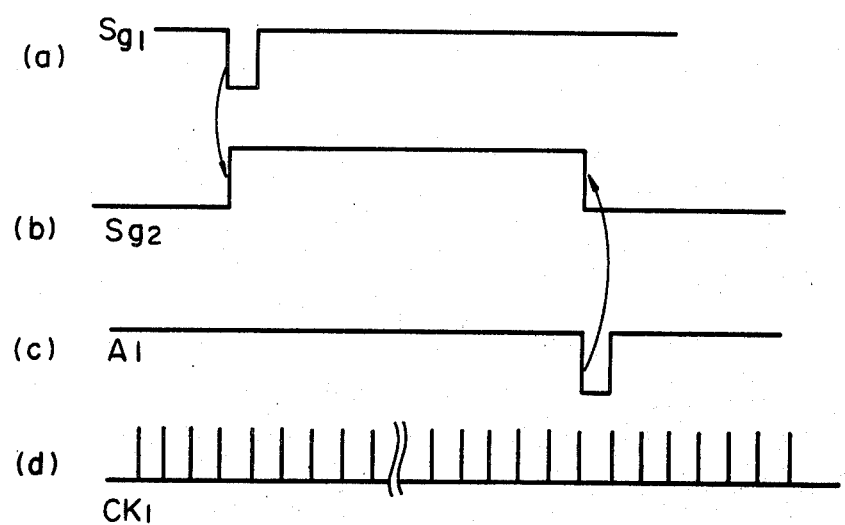

Diagrams of FIG. 7 illustrate the principle of the method of testing the bubble memory according to another embodiment of the present invention;

FIGS. 8A, 8B, 8C, 8D and 8E are circuit diagrams and a graph illustrating, in detail, each of the portions of the embodiment of FIG. 7; and FIGS. 9A and 9B are a block diagram illustrating the method according to a further embodiment of the present invention, and a timing chart showing wave forms of each of the portions.

DESCRIPTION OF THE PREFERRED EMBODIMENTS

Figure 1:
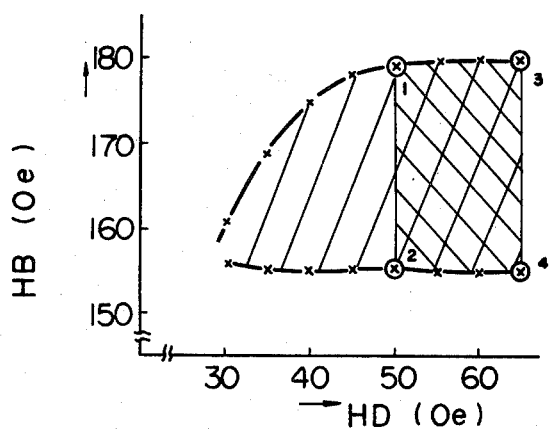
FIG. 1 is a diagram illustrating characteristic curves of margins of a bubble memory.

Referring to FIG. 1, in which the abscissa represents a driving magnetic field $H_D$ and the ordinate represents a biasing magnetic field $H_B$, characteristics of a bubble memory are usually represented by a hatched portion which is surrounded by threshold values of operation. In particular, to operate the bubble memory, current pulses of predetermined conditions must be fed to various electrically conductive patterns, such as a generator, an annihilator, a replicator, a transfer switching gate, and the like. The operating region of biasing magnetic field $H_B$ for these current pulse conditions also serves as an important factor for expressing the characteristics of the bubble memory. With reference, for example, to the generator, changes in characteristics relative to the pulse current conditions are illustrated below in conjunction with FIGS. 2A to 2D.

Figure 2A:
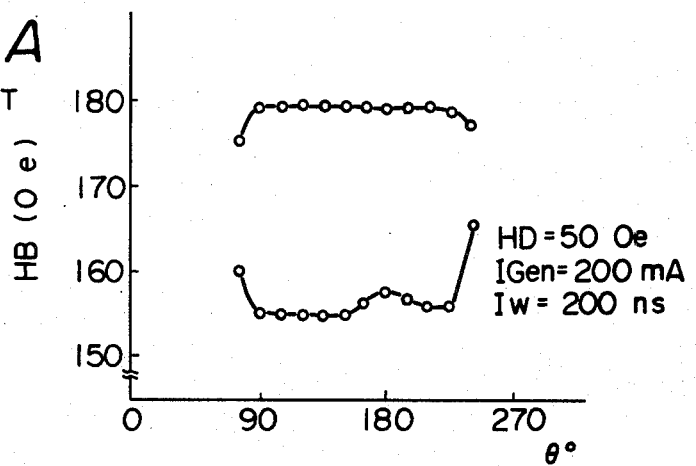
FIGS. 2A, 2B, 2C and 2D are diagrams for illustrating changes in the characteristics of a bubble element with respect to pulse current conditions of a generator.
Figure 2B:
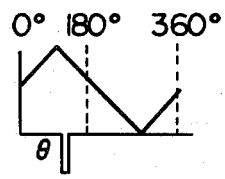

FIG. 2A is a diagram illustrating phase characteristics of the generator, in which the abscissa represents a phase $\theta$ and the ordinate represents a biasing magnetic field $H_B$. FIG. 2B is a diagram for illustrating the phase $\theta$ of FIG. 2A, and shows a wave form of a drive current fed to the bubble memory. FIG. 2B illustrates the case in which a triangular wave form current is used as a drive current, and the amount of deviation from a phase angle 0° of a pulse current supplied to the generator is denoted by $\theta$.

Phase characteristics represented by the curves of FIG. 2A occur when the driving magnetic field is set to be $H_D=50$ oersteds, the pulse current is set to be $I_{Gen}=200$ milliamperes, and the pulse width is set to be $I_w=200$ nanoseconds, all in a fixed manner.

Figure 2C:
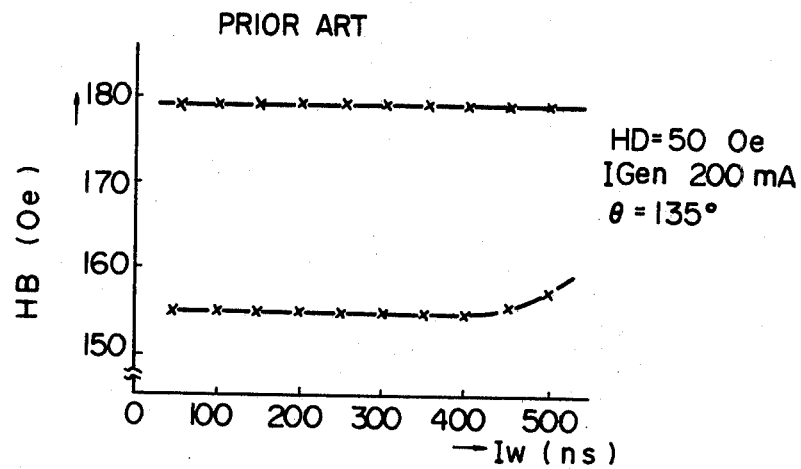

FIG. 2C is a diagram showing pulse width characteristics of the generator, in which the abscissa represents a pulse width $I_w$ and the ordinate represents a biasing magnetic field $H_B$.

The pulse width characteristics of FIG. 2C are obtained when the driving magnetic field is set to $H_D=50$ oersteds, the pulse current $I_{Gen}$ is set to 200 milliamperes, and the phase of the pulse current is set to $\theta=135°$, all in a fixed manner.

Figure 2D:
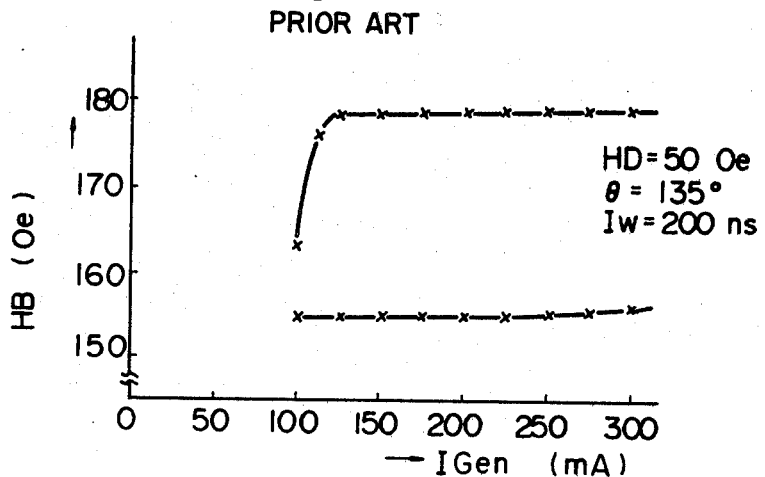

FIG. 2D is a diagram illustrating current characteristics of the generator, in which the abscissa represents a pulse current $I_{Gen}$, and the ordinate represents a biasing magnetic field $H_B$. The pulse current characteristics of FIG. 2D are obtained when the driving magnetic field is set to $H_D=50$ oersteds, the phase of pulse current is set to $\theta=135°$ C., and the pulse width is set to $I_w=200$ nanoseconds, all in a fixed manner.

FIGS. 2A, 2C and 2D illustrated the phase characteristics, pulse width characteristics and current characteristics of the generator. If these characteristics exist independently of each other, the generator will properly operate over a phase range of 90° to 225°, a pulse width range of 50 to 450 nanoseconds, and a current range of 125 to 300 milliamperes.

In practice, however, the generator does not properly operate when various signal components, i.e., phases, pulse widths and currents, satisfy the above-mentioned ranges. This fact is illustrated below with reference to FIG. 3 which is based upon the experimental results.

Figure 3:
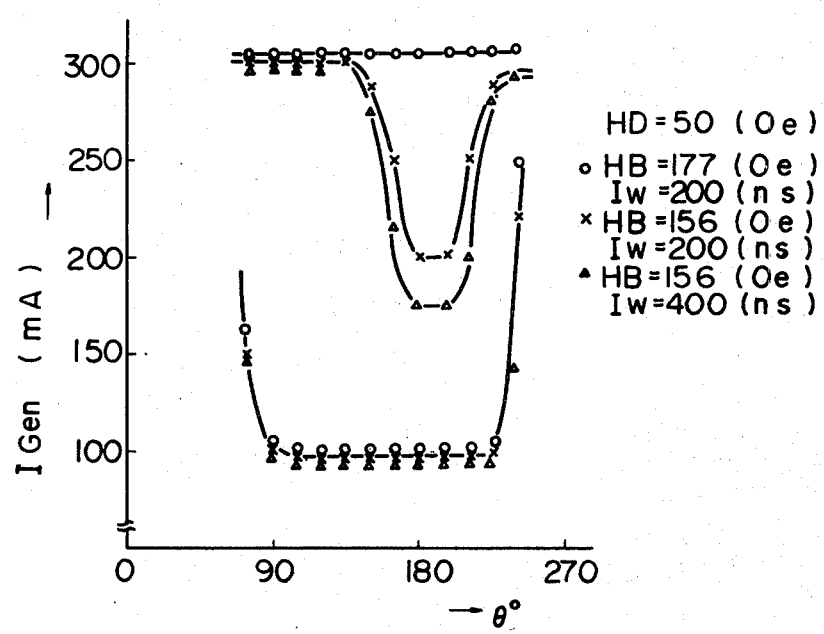
FIG. 3 is a diagram illustrating the operation characteristics of the generator.

FIG. 3 is a diagram for illustrating the operation characteristics of the generator when the above-mentioned various signal components are combined, in which the abscissa represents a phase of current and the ordinate represents a current.

The curves of FIG. 3 are obtained when the driving magnetic field is set to $H_D=50$ oersteds, in which a mark o represents the case when the pulse width $I_w$ is 200 nanoseconds and the biasing magnetic field $H_B$ is 177 oersteds; a mark x represents the case when the pulse width is $I_w$ is 200 nanoseconds and the biasing magnetic field $H_B$ is 156 oersteds, and a mark Δ represents the case when the pulse width $I_w$ is 400 nanoseconds and the biasing magnetic field $H_B$ is 156 oersteds.

In the region where the current phase $\theta$ lies in the vicinity of 180° in a low biasing magnetic field $H_B$ in the curves marked with x and Δ, the maximum value of pulse current $I_{Gen}$ is about 170 milliamperes. This, in other words, means that the individual characteristics do not exist independently of each other. For instance, the pulse current is directly affected by the phase, biasing magnetic field and pulse width. Therefore, the variation ranges cannot be guaranteed to be acceptable if the characteristics are independently measured. Although the above description has dealt with the characteristics of the generator, the same holds true for other functional gates.

Thus, acceptable operation cannot be guaranteed unless allowable variation ranges are guaranteed by taking into consideration the effects of the characteristics upon each other in testing the bubble memory.

FIGS. 4A through 4D are drawings illustrating the outline for testing the bubble memory. FIG. 4A shows a portion of a Table of test plans, which illustrate combinations of test elements (input signal components). Referring to variable test elements, minimum values are represented by "−", standard values are represented by "0", and maximum values are represented by "+". FIGS. 4B through 4D diagramatically illustrate outlines of three variables "−", "0" and "+" in connection with the phase, pulse width and current respectively. Mentioned below is a method of testing five gates of a bubble memory based upon the planning Table of FIG. 4A. First, test 1 is carried out under a predetermined biasing magnetic field and driving magnetic field. With regard to the signals fed to the bubble generator Gen, the phase only is set to a value "−", and the pulse width and the current value are set to "0". As for the signals applied to all other functional gates, i.e., applied to a replicator Rep, an annihilator Ann, an input transfer gate Tr-in and an output transfer gate Tr-out, the phases only are set to "—", and the pulse widths and current values are set to "0". Here, for the purpose of convenience, the driving magnetic field $H_D$ is set to 50 oersteds. Under this condition, the test is effected to determine whether the bubble memory properly operates. Then, test 2 is carried out. In test 2, pulse widths of signals applied to the functional gates including the bubble generator Gen are set to "—", but the signals applied to the bubble generator Gen and to other gates are set to "0".

Thereafter, combinations of tests 3, 4, - - - n ($3^3=27$ in this case) are digitally set, being controlled by a computer, and the tests are carried out successively. After all of the combinations have been tested, the biasing magnetic field $H_B$ is reset without changing the driving magnetic field $H_D$, and tests 1 through n are repeated for a predetermined number of times in the same manner as mentioned above. Finally, bias margin values ① and ② are found, as shown in FIG. 1, with the driving magnetic field being set to $H_D=50$ oersteds. The driving magnetic field $H_D$ is then set, for example, to 65 oersteds and the test is repeated in the same manner as mentioned above to find bias margin values ③ and ④ under the driving magnetic field $H_D$ of 65 oersteds. Thus, there are a great many combinations even when only three points are tested in regard to the testing elements of the various functional gates, and lengthy testing time is required. Furthermore, the measurements of only two or three points for each of these testing elements fail to guarantee the operating conditions in the regions between such points. For example, referring to phase-current characteristics of the generator as shown in FIG. 3, the generator operates on currents of 100 to 275 mA at two points, i.e., at 150° to 225°, but operates on a current range of as narrow as 100 to 175 mA at around 180° which lies between the above-mentioned two points. Therefore, even if the test is performed in accordance with the lengthy and time consuming method, a significant number of devices among those which have passed the test turn out to be defective after they have been placed in practical use. This is due to the fact that when only particular values of the test elements are combined, the devices may properly operate under such combinations, but do not properly operate under other combinations. It can be empirically foreseen to some extent which combinations of which values of the test elements are most likely to develop erroneous operations, or in other words, which combinations provide the narrowest or the poorest operating margins. In practice, however, the design requirements and variance depending upon the lots, make it difficult to foresee the desirable combinations. If the worst combinations are known, they could be taken into consideration during the stage of test planning. With the worst combinations unforeseeable, however, there is no way to cope with the situation.

Figure 5A:
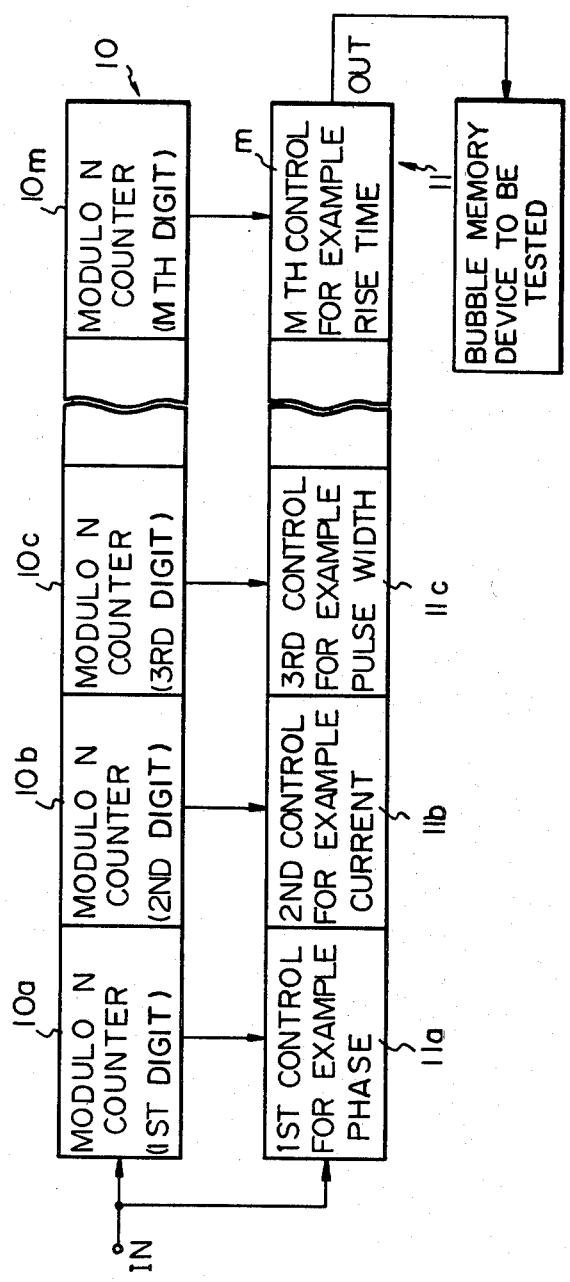
FIGS. 5A and 5B are block diagrams illustrating a method of testing the bubble memory according to the present invention.
Figure 5B:
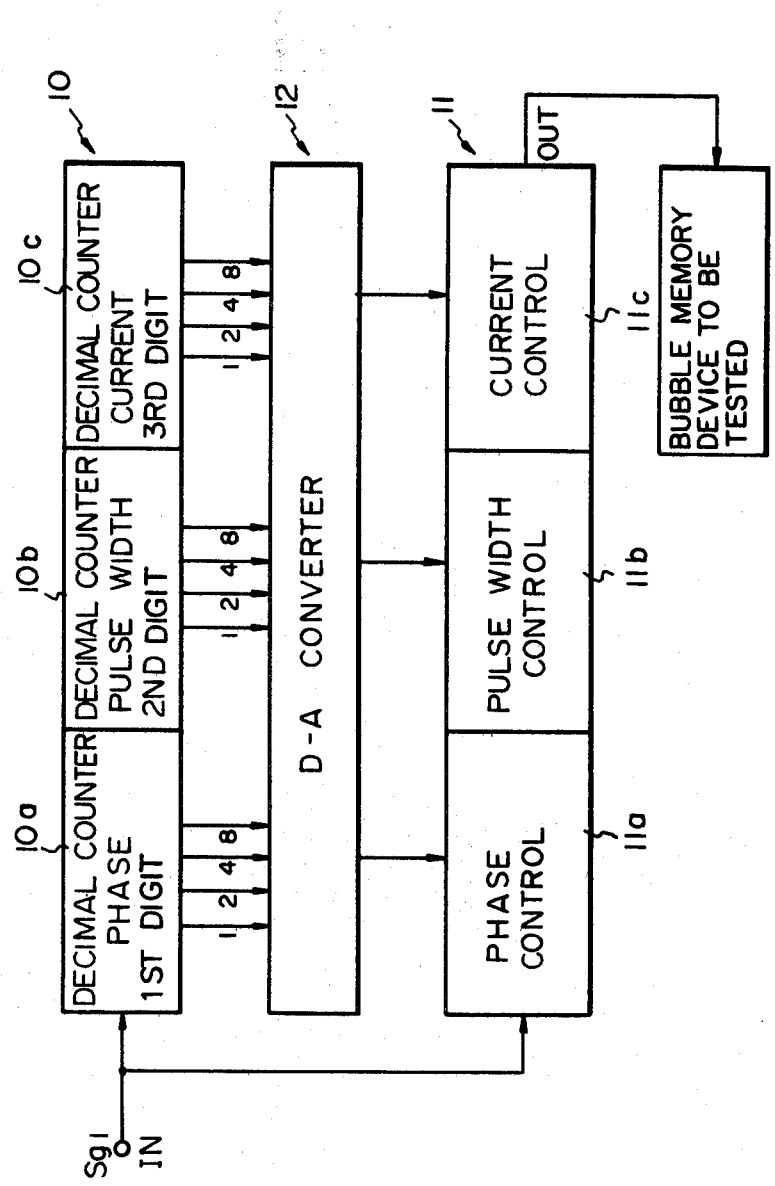

FIGS. 5A and 5B illustrate an embodiment of the present invention, wherein FIG. 5A shows a counter consisting of a modulo n counter of m digits, and an externally controlled pulse generator 11 which is controlled by the data of digits 10a, 10b, 10c, - - - 10m and which determines the state of the output. Described below is a decimal counter of 3 digits with reference to FIG. 5B. As for the digits 10a, 10b and 10c of the counter 10, for example, a first digit of 1 deals with the phase control, a second digit of 10 deals with the pulse width control, and a third digit of 100 deals with the amplitude control.

Binary coded signals produced from each of the digits of the counter 10 are subjected to the digital to analog conversion by a D/A converter 12, and are converted into voltages corresponding to data signals of from 0 to 9. The data corresponding to the phase, pulse width and current, which are converted into voltage signals, are respectively fed to the control units 11a, 11b and 11c of the pulse generator 11.

Figure 6A:
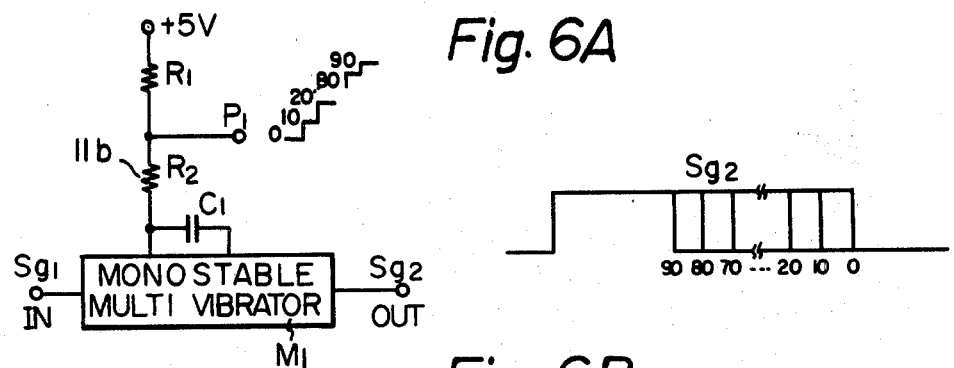
FIGS. 6A, 6B and 6C are circuit diagrams illustrating, in detail, each of the portions of FIG. 5B.
Figure 6B:
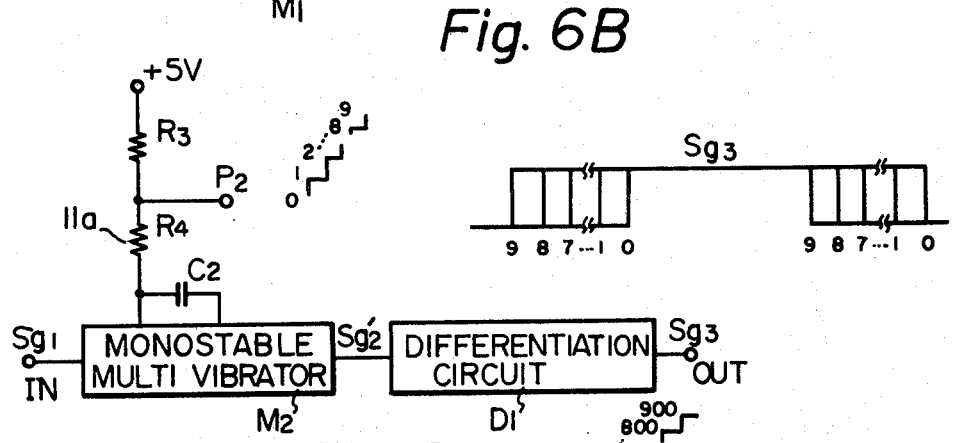
Figure 6C:
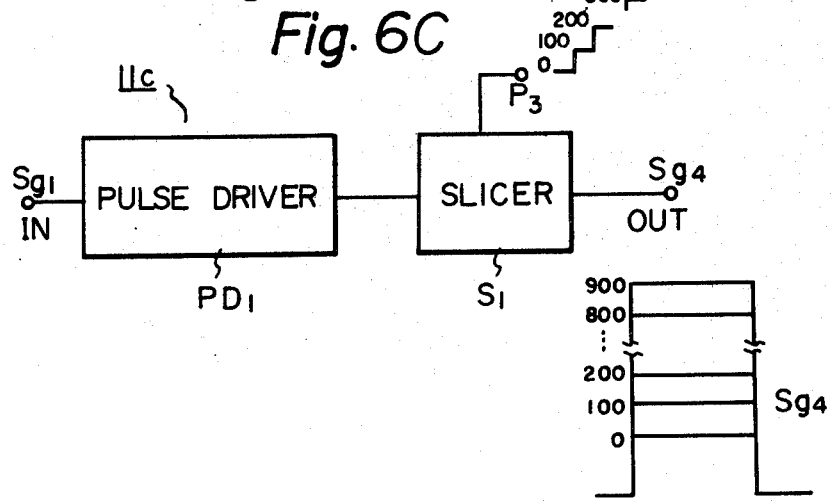

FIGS. 6A through 6C illustrate circuit setups of the control units 11a, 11b and 11c, according to the embodiment of the present invention. FIG. 6A shows a circuit for the pulse width, in which symbol $M_1$ denotes a monostable multivibrator, and symbols $R_1$, $R_2$ and $C_1$ denote resistors and a capacitor which together constitute a time control element for the monostable multivibrator. An end of the resistor $R_1$ is connected to a d-c power supply of +5 volts, and a connection point $P_1$ between the resistors $R_1$ and $R_2$ is connected to the D/A converter 12 illustrated in FIG. 5B. The output pulse of the gate pulse generator circuit of the bubble memory or a pulse $Sg_1$ which is obtained by shifting the phase of the output pulse, is fed to a trigger pulse input terminal IN of the circuit of FIG. 6A, whereby a pulse $Sg_2$ of a rectangular wave form of a predetermined width, as shown in the diagram on the right side of FIG. 6A, is produced from an output terminal OUT. Here, the pulse width of the pulse $Sg_2$ is determined by a time constant which is the product of the resistors $R_1$, $R_2$ and the capacitor $C_1$ and by a power supply voltage. The power supply voltage is the sum of a constant voltage of +5 volts and a voltage which is determined by an output of the second digit 10b of the counter 10 shown in FIG. 5B and which is fed to the pulse width control unit 11b via the D/A converter 12. Consequently, the pulse width of the output pulse $Sg_2$ varies, as shown in the diagram on the right side of FIG. 6A. Outputs of the second digit 10b of the counter 10 fed to the input terminal $P_1$ are denoted by 0, 10, 20, - - - 90.

FIG. 6B illustrates a circuit for changing the phase of the pulse current, in which symbol $D_1$ denotes a differentiation circuit, $R_3$ and $R_4$ denote resistors, $C_2$ denotes a capacitor, and $M_2$ denotes a monostable multivibrator. To change the phase of the pulse current, the signal $Sg_2'$, which is the same as the output pulse $Sg_2$ obtained from the circuit of FIG. 6A, is fed to the differentiation circuit $D_1$; i.e., the differentiation circuit $D_1$ produces an output pulse $Sg_3$ whose phase can be easily varied. The signals fed to the terminal $P_2$ are outputs 0, 1, 2, - - - 9 of the first digit 10a of the counter 10, which are fed to the phase control unit 11a via the D/A converter 12 shown in FIG. 5B.

FIG. 6C illustrates a circuit for changing the current value of the pulse current, in which symbol $PD_1$ denotes a pulse driver, $S_1$ denotes a slicer, and $P_3$ denotes an input terminal. The input terminal $P_3$ receives outputs 0, 100, 200, - - - 900 from the third digit 10c of the counter 10, which are fed to the current control unit 11c via the D/A converter 12 shown in FIG. 5B. The amplitude of a pulse current $Sg_4$ produced from the slicer $S_1$ to the ouput terminal OUT is changed as shown in the diagram on the right side.

As will be obvious from FIG. 5B, as the input pulses $Sg_1$ are fed to the input terminal IN, the counter 10 repeats the counting operation of from 0 to 999 upon receipt of each pulse $Sg_1$, whereby the output synthesized by the phase control unit 11a, pulse width control unit 11b and the current control unit 11c which are connected to their corresponding digits 10a, 10b and 10c of the counter 10, is successively changed depending upon the contents of the counter 10. Therefore, when 1000 input pulses $Sg_1$ are introduced, all of the combinations for the signal components of phase, pulse width and current value, are completed. Even with regard to the Tr-in and Tr-out pulses which are fed in the smallest number to the transfer gate during one cycle of writing, reading and collating information, about 500 such pulses are produced with a 64-kilobit device. Therefore, all of the combinations are completed when the cycle for writing, reading and collating information is performed twice. This means that the method of the present invention features a test precision which is increased by 3.3 times and a test speed which is increased by 13.5 times as compared with the conventional test methods. With a 256-kilobit device, Tr-in and Tr-out pulses are produced in a number of about 1000, and all of the combinations are completed through one cycle of writing, reading and collating information. In this case, the test precision is increased by 3.3 times and the test speed is increased by 27 times as compared with the conventional test methods.

According to the method of the present invention described above, the time required for the test is reduced with the increase in the memory capacity. Consequently, the method of the present invention is very effective for testing the larger capacity bubble memories which will be assembled in the future.

In the aforementioned embodiment, the outputs were controlled in an analog manner relying upon the output voltages that were obtained by converting the digital signals into analog signals. The outputs, however, can be directly controlled in a digital manner based upon the outputs of the counter. Also in the aforementioned embodiment, the state was changed upon receipt of each input pulse. According to another embodiment of the present invention, however, the state may be changed after each receipt of n input pulses.

The following is a description of another embodiment according to the present invention. FIG. 7 illustrates a principle of the test method according to another embodiment of the present invention. Namely, the test method guarantees the allowable variation ranges for various input signal components, such as phase, pulse width and current value of a gate pulse applied to the bubble memory. A plurality of signal components produced by independently operating the generators are periodically varied out of synchronism, thereby to obtain any combination of the variety of signal components. These combinations are applied to the bubble memories being tested. The diagram (a) illustrates the state in which a variety of signal components are periodically changed or, in other words, illustrates the change of the phase of a pulse wave form. A pulse wave form, indicated by a thick line, changes its phase, under the control of a circuit that will be mentioned later, and periodically changes between a minimum value and a maximum value, (indicated by hatched lines). The diagram (b) shows the change of a pulse width. The pulse width periodically changes between a minimum width and a maximum width out of synchronism with the change in phase of the pulses. The diagram (c) shows the change in current. The current periodically changes between a minimum value and a maximum value out of synchronism with the phase or the like. Thus, the three signal components are periodically changed out of synchronism with each other, and are fed to the functional gates of the bubble memory. Therefore, the pulse signals, applied to each of the functional gates spontaneously, change their shapes and positions within maximum values of amplitude and phase as shown in the diagram (d), and hence include any possible combinations of phase, pulse width and current value within required test ranges. Here, changes of signal components are not brought into synchronism. This is because, if the signal components are brought into synchronism, a pulse width, for example, will be fixed constant relative to a given phase, and this makes it difficult to realize all possible combinations. Similarly, signals fed to each of the functional gates are set to be out of synchronism with each other. In so doing, signals of all possible combinations are fed to each of the fuunctional gates based upon the same principle, and it is possible to perform a complete test including checking mutual interference.

For the purpose of convenience, the foregoing description has dealt with the case in which the phase, pulse width and current value of the pulse current fed to the functional gates of the bubble memory were changed, i.e., when three input signal components were changed. The driving magnetic field will also serve as an input signal component. In this case, four components are changed out of synchronism, and are further brought out of synchronism among the individual functional gates. That is to say, a total of 19 channels are changed out of synchronism, i.e., Gen×3, Ann×3, Rep×3×2 (since two kinds of pulse are used), Trin×3, Trout×3, and $H_D$×1.

Threshold values of operative and inoperative regions are found while continously changing the biasing magnetic field under the above-mentioned conditions. In other words, it is possible to find a window of operating margin characteristics in a form which includes every gate condition and combination, i.e., it is possible to find a region which lies below a straight line connecting ① and ③ and above a straight line connecting ② and ④ of FIG. 1.

Described below is the method of periodically changing the signal components out of synchronism, in accordance with the embodiment of the present invention described in conjunction with FIG. 7

FIG. 8A illustrates a circuit for periodically changing the pulse width, in which symbol $M_3$ denotes a monostable multivibrator, symbols $R_5$, $R_6$ and $C_3$ denote resistors and a capacitor which constitute a time control element for the monostable multivibrator, and $O_1$ denotes an oscillator which generates continuous waves, such as sinusoidal waves, triangular waves or rectangular waves. An end of the resistor $R_5$ is connected to a dc power supply of +5 volts, and the output of the oscillator $O_1$ is fed to a connection point $P_5$ between the resistors $R_5$ and $R_6$. With this circuit, an output pulse of the gate pulse generator circuit of the bubble memory, or a pulse $Sg_1$ obtained by shifting the phase of the output pulse, is fed to a trigger pulse input terminal IN, whereby a pulse $Sg_2$ of a rectangular wave form having a predetermined width is obtained from the output terminal OUT. The width of the pulse $Sg_2$ is determined by a time constant which is the product supply voltage. Here, since the power supply voltage is the sum of a constant voltage of +5 volts and a voltage produced by the oscillator $O_1$ which varies in the form of a triangular wave, the width of the output pulse $Sg_2$ varies widely with a predetermined width as a center, as diagramatized in FIG. 8A. The change in pulse width is in synchronism with the output of the oscillator $O_1$. The oscillator $O_1$ produces an output out of synchronism with the trigger pulses $Sg_1$ and at a frequency over a range of from several tens of hertz to several hundreds of herts, which is very low compared to the frequency of the trigger pulses $Sg_1$ which are over a range of several kHz to several MHz. Therefore, the output terminal OUT produces many rectangular-wave pulses $Sg_2$ of which the width varies continuously and periodically.

FIG. 8B illustrates a circuit which produces pulses while periodically changing the phase and the pulse width independently of each other. This circuit consists of two circuits of FIG. 8A which are connected in series. In FIG. 8B, symbols $M_4$, $M_5$ denotes monostable multivibrators, and symbols $R_7$, $R_8$, $R_9$, $R_{10}$, $C_4$ and $C_5$ denote resistors and capacitors which correspond to $R_5$, $R_6$ and $C_3$ of FIG. 8A. The principle for changing the phase and the pulse width of the output pulse $Sg_3$ produced by this circuit, is illustrated below in conjunction with FIG. 8E. When a trigger pulse $Sg_1$ is fed to the input terminal IN of FIG. 8B and a triangular wave for modulation is applied to the input terminal $P_6$, the monostable multivibrator $M_4$ produces a pulse $Sg_2$ of which the pulse width periodically changes, as mentioned above. The diagram (a) of FIG. 8E illustrates, in an exaggerated manner, the change in pulse width of the pulse $Sg_2$. The pulse $Sg_2$ is then fed to the second monostable multivibrator $M_5$ to trigger it, and a triangular wave similar to that fed to the terminal $P_6$ is applied to a connection point $P_7$ between the resistor $R_9$ and the resistor $R_{10}$, whereby the output terminal OUT of the monostable multivibrator $M_5$ produces a pulse $Sg_3$ which periodically changes in the phase and width, as shown in diagram (b) of FIG. 8E. Namely, since the second monostable multivibrator $M_5$ is triggered by the break of the pulse $Sg_2$, the output pulse $Sg_3$ possesses phase shifts $\phi_1$, $\phi_2$ which correspond to the pulse widths of the pulse $Sg_2$, and varies the width from $W_1$ to $W_2$ depending upon the amplitude of the triangular wave applied to the terminal $P_7$. Generators operate independently of each other to produce triangular waves that are fed to the terminals $P_6$ and $P_7$. Therefore, the phase and the pulse width vary independently of each other and out of synchronism with the input signals $Sg_1$.

FIG. 8C shows a circuit for periodically changing the gate current. The output side of a high-impedance constant-current driver $ID_1$, which produces pulses of a rectangular wave form, is served with a current of a triangular wave which is introduced from a terminal $P_8$ via an impedance converter $I_1$ which increases the impedance. The two currents are therefore superposed, and the output terminal OUT produces a pulse current $Sg_4$ of which the amplitude varies, as illustrated on the right side of FIG. 8C.

The period of variation of amplitude, i.e., the period of variation of current, is in agreement with the period of triangular waves being introduced.

Finally, FIG. 8D illustrates a circuit for periodically changing the magnitude of the driving magnetic field of the bubble memory, in which symbol $E_1$ denotes a control source which amplifies a signal fed to a voltage control terminal $P_9$. When a triangular wave is fed to the control terminal, the output side of the control source $E_1$ produces a voltage which varies in accordance with the triangular wave. The voltage is then fed as a power supply voltage to a driver $CD_1$ for driving the coil, whereby a current $Sg_5$, which changes in amplitude in response the change in the power supply voltage, is obtained. Here, the frequency of a triangular-wave current produced by the driver $CD_1$ is much higher than the frequency of triangular-waves fed to the terminal $P_9$; the two frequencies are not in synchronism with each other. If two such circuits are provided to obtain two triangular-wave currents $Sg_5$ of which the phases are shifted by 90° relative to each other, and if such currents are permitted to flow into the X-drive and Y-drive coils, there can be established a rotary magnetic field having an intensity which changes periodically.

A further embodiment of the pulse generator circuit, to which the present invention is applied, is illustrated below with reference to FIG. 9A.

FIG. 9A is a block diagram of a pulse generator circuit, and FIG. 9B is a time chart. In FIG. 9A, reference numeral 21 denotes a high-speed counter for counting high-speed clock pulses $CK_1$; 22 denotes a delay time control counter; 23 denotes a modulation width control counter for counting low-speed clock pulses $CK_2$; 24 and 25 denote registers for storing control data which control the counters 22, 23; reference numeral 26 denotes a latch circuit for storing the contents of the counter 22; 27 denotes a coincidence circuit for collating the contents of the counter 21 with the contents of the latch circuit 26, and 29 denotes a set/reset flip-flop circuit.

The counters 21 and 22 have the same number of digits. The clock pulses $CK_1$ drive the high-speed counter 21, as shown in the diagram (d) of FIG. 9B, thereby to determine the notch of a delay time for the input pulses $Sg_1$.

For example, if the clock signals $CK_1$ have a frequency of 20 MHz, a minimum notch of the delay time is 50 nanoseconds. Clock pulses $CK_2$ drive the counters 22, 23 and have a frequency, according to this embodiment, of from several kilohertz to several tens of kilohertz. The frequency of the clock pulses $CK_2$, however, need not be particularly specified provided it is smaller than the frequency of the clock pulses $CK_1$.

The operation of the embodiment is described below.

The delay time control counter 22 which is preset by the register 25 which stores a delay quantity control data (for example, 100) starts to count the clock pulses $CK_2$ in a manner of 101, 102, 103, upon each receipt of the clock pulse $CK_2$. At the same time, the modulation width control counter 23 also counts the clock pulses in a manner of 1, 2, and 3. As the counted number reaches the data stored in the register 25, which stores a modulation width control data (for example, 10), the modulation width control counter 23 is reset to 0 by the output of the coincidence circuit 28. At the same time, the counter 22 is also preset to 100. Namely, the counter 22 repeats the counting operation starting from the data stored in the register 24 up to the sum of the data stored in the registers 24, 25 (i.e., from 100 to 110 in this embodiment). The content of the counter 22 at a given point is taken into the latch circuit 26 by a strobe signal, and is fed to a terminal of the coincidence circuit 27.

Here, as an input pulse $Sg_1$ is introduced through the input terminal IN, the high-speed counter 21 is reset to initiate the operation for counting the high-speed clock pulses $CK_1$ (of a frequency of, for example, 20 MHz). Further, the input pulse $Sg_1$ sets the flip-flop circuit 29. These states are illustrated in the diagrams (a) and (b) of FIG. 9B. The content of the high-speed counter 21 is fed to another terminal of the coincidence circuit 27 which produces a coincidence output when the thus introduced content comes into agreement with the content of the latch circuit 26. The coincidence output causes the flip-flop circuit 29 to be reset and the high-speed counter 21 to cease its operation. In this case, the output pulse $S_{g2}$ produced on the output terminal OUT of the flip-flop circuit 29 rises at the front edge of the input pulse $S_{g1}$ and breaks at the front edge of the coincidence output from the coincidence circuit 27.

The transition of the state can be easily comprehended from the time chart of FIG. 9B.

For example, if the data of the latch circuit 26 is 102, the pulse width of the output pulse $S_{g2}$ becomes 50 (nS)×102=5.1 ($\mu$S).

If the input pulse $S_{g1}$ is introduced before the data of the latch circuit 26 becomes 103, the output pulse $S_{g2}$ having width of 5.1 $\mu$S is produced again. However, if the clock pulses $CK_2$ have a frequency 10 kHz, the data of the latch circuit 26 becomes 103 after a time of 100 $\mu$S has passed. Therefore, when the input pulse $S_{g1}$ is introduced after the above-mentioned time has passed, the output pulse having a width of 50 (nS)×103=5.15 ($\mu$S) is produced. Here, if a strobe signal $S_T$ supplied to the latch circuit 26 is brought into synchronism with the clock pulse $CK_2$, the embodiment represents the case of a saw-tooth wave of 100 $\mu$S (period of clock pulses $CK_2$)×10(data of the register 25)=1 mS, i.e., when a saw-tooth wave of 1 kHz is applied to the control terminal $P_5$ which is connected to the monostable multivibrator of the preceding embodiment illustrated in FIG. 8A. Therefore, the width of variation is 50 nS (period of clock pulses $CK_1$)×10 (data of the register 25)=500 nS.

According to the third embodiment of the present invention, the form of variation, i.e., the wave form corresponding to the output wave form of the oscillator $O_1$ in the preceding embodiment illustrated with reference to FIG. 8A, can be arbitrarily modified by changing the counting mode of the delay time control counter 22 and the strobe signals $S_T$.

In effect, if the delay time control counter 22 is made up of an up-down counter, and strobe signals $S_T$ are continuously introduced in synchronism with the clock pulses $CK_2$, the result is equivalent to the case when the signals are modified by triangular waves. If the strobe signals $S_T$ are taken from the reset signals of the counters 22 and 23, i.e., taken from the outputs of the coincidence circuit 28, the result is equivalent to the case when the signals are modified by rectangular waves.

The relation between the input pulse $S_{g1}$ and the output pulse $S_{g2}$ of the second embodiment is quite equal to the relation between the input and the output of the monostable multivibrator $M_3$ mentioned in the preceding embodiment with reference to FIG. 8A. If two sets of the circuit are employed, the phase and the pulse width can be controlled independently of each other in quite the same manner as the case when the two monostable multivibrators $M_4$ and $M_5$ are connected, as illustrated in the preceding embodiment with reference to FIG. 8B.

Generators which operate independently of each other when a variety of functional gates are to be simultaneously controlled, are equivalent to the generator for producing clock pulses $CK_2$ of the embodiment, which is not diagrammed.

To control the current, the output pulses $S_{g2}$ should be integrated to obtain an output voltage corresponding to the width of pulses. The output voltage is then applied to the current control terminal $P_8$ of the preceding embodiment (refer to FIG. 8C), to modulate the current quite in the same manner as mentioned earlier.

In actually conducting the test, only some of the signal components may be varied while maintaining other signal components unchanged, or only several values may be measured.

According to the test method of the present invention, as illustrated in the foregoing, values of input signal components of the bubble memory are varied out of synchronism and quite independently of the test routines (writing, reading and collation) to obtain every possible combination of values of the signal components. Consequently, the operation test can be effected under such conditions that necessarily include the worst combinations. Therefore, the operating margins can be completely guaranteed.

Moreover, such a complete test can be effected within very short periods of time, compared to conventional test methods, thus presenting greatly increased reliability for testing the products.

We claim:

1. A method of testing a magnetic bubble device to guarantee allowable variation ranges for a variety of signal components, including phase, pulse width, and amplitude, of input signals which are applied to a magnetic bubble element when the magnetic bubble device is to be actuated, comprising the steps of:
   generating input pulses;
   setting said variety of signal components into a plurality of predetermined conditions independently of each other;
   changing, in order, said signal components in accordance with said plurality of predetermined conditions, in dependence upon said input pulses; and
   applying said input signals to said magnetic bubble element a plurality of times within one testing cycle for writing, reading, and collating information, by changing the combinations of the plurality of conditions of said signal components in response to the input pulses, the magnetic bubble device passing the test when the write information and the read information coincide.

2. A method of testing a magnetic bubble device according to claim 1, wherein the step of changing said signal components, comprises:
   counting the input pulses by providing a counter unit comprising an m-digit modulo n counter; and
   generating binary coded signals in dependence upon the counted pulses; and wherein the step of applying said plural input signals comprises:
   determining the condition of the input signals by providing a control unit which receives said input pulses, and which is controlled by the binary coded signals generated by each of the digits of the modulo n counter of the counter unit.

3. A method of testing a magnetic bubble device according to claim 2, further comprising the steps of converting the binary coded signals of each digit of the modulo n counter of said counter unit into analog signals by providing a D/A converter, and providing said analog signals to control said control unit.

4. A system for testing a magnetic bubble device to guarantee the acceptable range variation for a variety of input signal components of an input signal applied to a magnetic bubble element when the magnetic bubble device is to be used, said system operatively connected to receive trigger pulses, said system comprising:

counter means for counting the trigger pulses and for generating first, second and third binary coded signals; and pulse generator means, operatively connected to receive the trigger pulses and operatively connected to said counter means, for receiving said first, second and third binary coded signals and for generating, as the input signal, a variable width pulse signal, a variable phase signal and a variable current signal for use in testing the magnetic bubble device, the input signal being generated each time one of the trigger pulses is received.

5. A system as set forth in claim 4, further comprising a digital to analog converter, operatively connected between said counter means and said pulse generator means, for converting said first, second and third binary coded signals into an analog phase signal, an analog pulse width signal and an analog current signal which are provided to said pulse generator means.

6. A system for testing a magnetic bubble device to guarantee the acceptable range variation for a variety of input signal components of an input signal which is applied to a magnetic bubble element when the magnetic bubble device is to be used, said system operatively connected to the magnetic bubble device and operatively connected to receive trigger pulses, said system comprising:

counter means for counting the trigger pulses and for generating first, second and third binary coded signals, a digital to analog converter, operatively connected to said counter means, for converting said first, second and third binary coded signals into an analog phase signal, an analog pulse width signal and an analog current signal; and a pulse generator, operatively connected to said digital to analog converter and to the magnetic bubble device, and operatively connected to receive the trigger pulses, for generating the input signal each time one of the trigger pulses is received, said pulse generator comprising:

a phase control unit, operatively connected to said digital to analog converter, for receiving said analog phase signal and the trigger pulses, and for generating a variable phase signal in dependence upon the trigger pulses;

a pulse width control unit, operatively connected to said digital to analog converter, for receiving said analog pulse width signal and the trigger pulses, and for generating a variable pulse width signal in dependence upon the trigger pulses; and a current control unit, operatively connected to the digital to analog converter, for receiving said analog current signal and the trigger pulses, and for generating a variable current signal in dependence upon the trigger pulses, the input signal comprising the variable phase signal, the variable pulse width signal, and the variable current signal.

7. A system as set forth in claim 6, wherein said counter means comprises an m-digit modulo n counter, where n and m are integers.

8. A system as set forth in claim 6, wherein said system is operatively connected to voltage supply means, and wherein said phase control unit comprises:

a first resistor connected to the voltage supply means and operatively connected to said digital to analog converter at a first node;

a second resistor connected at said first node;

a first capacitor connected to said second resistor at a second node;

a first monostable multivibrator circuit connected at said second node and operatively connected to receive the trigger pulses; and a differentiation circuit, operatively connected to said first monostable multivibrator circuit, for generating said variable phase signal.

9. A system as set forth in claim 6 or 8, wherein said pulse width control circuit comprises:

a third resistor connected to the voltage supply means and connected to said digital to analog converter at a third node;

a fourth resistor connected at said third node;

a second capacitor connected to said fourth resistor at a fourth node; and a second monostable multivibrator circuit, connected at said fourth node and operatively connected to receive the trigger pulses, for generating said variable pulse width signal.

10. A system as set forth in claim 9, wherein said current control unit comprises:

a pulse driver circuit operatively connected to receive the trigger pulses; and a slicer circuit, operatively connected to the pulse driver circuit and to said digital to analog converter, for generating said variable current signal.

11. A system for testing a magnetic bubble device to guarantee acceptable range variation for a variety of input signal components of an input signal which is applied to a magnetic bubble element when the magnetic bubble device is to be used, said system operatively connected to the magnetic bubble device and operatively connected to receive trigger pulses, said system comprising:

width and phase varying means, operatively connected to receive the trigger pulses and operatively connected to the magnetic bubble device, for generating a variable pulse width and phase signal each time one of the trigger pulses is received;

current varying means, operatively connected to receive the trigger pulses and to the magnetic bubble device, for generating a variable current signal each time one of the trigger pulses is received;

driving magnetic field varying means, operatively connected to the magnetic bubble device, for generating a variable driving magnetic field signal each time one of the trigger pulses is received.

12. A system for testing a magnetic bubble device to guarantee acceptable range variations for a variety of input signal components which are applied to a magnetic bubble element when the magnetic bubble device is to be used, said system operatively connected to receive trigger pulses, a strobe signal, a first clock pulse signal and a second clock pulse signal, said system comprising:

a first register for storing delayed quantity control data;

a second register for storing modulation width control data;

a modulation width control counter circuit, operatively connected to receive the second clock pulse signal, for counting the second clock pulses and for generating a first counted output signal;

a first coincidence circuit, operatively connected to said second register and to said modulation width control counter circuit, for comparing the contents of said second register to the contents of said modulation width control counter circuit and for providing a first reset signal to said modulation width control counter circuit and a preset signal when said contents are equal;

a delay time control counter circuit, operatively connected to said first register, said first coincidence circuit, said modulation width control counter circuit and operatively connected to receive the second clock pulse signal, for counting the second clock pulses and for generating a delayed counted output signal, said delay time control counter circuit being preset to the contents of said first register in accordance with said preset signal;

a latch circuit, operatively connected to said delay time control counter circuit and operatively connected to receive the strobe signal, for receiving said delay counted output signal in dependence upon the strobe signal;

a high-speed counter circuit, operatively connected to receive the first clock pulse signal and the trigger pulses, for counting the first clock pulses and for providing a high speed counted output signal, said high-speed counter circuit being reset every time one of the trigger pulses is received;

a second coincidence circuit, operatively connected to said latch circuit and said high-speed counter circuit, for comparing the contents of said high-speed counter circuit and said latch circuit and for providing a coincidence signal when the contents are equal, said high-speed counter circuit stopping counting every time it receives said coincidence signal; and a flip-flop circuit, operatively connected to said coincidence circuit and operatively connected to receive trigger pulses, said flip-flop circuit being set every time one of the trigger pulses is received, said flip-flop circuit being reset when the coincidence signal is received from said second coincidence circuit, wherein a variable pulse width output signal is produced between the time said flip-flop circuit is set and the time said flip-flop circuit is reset.

13. A system as set forth in claim 12 wherein said high-speed counter circuit and said delay time control counter circuit have the same number of digits.

14. A system as set forth in claim 12, wherein the frequency of the second clock pulses is less than the frequency of the first clock pulses.

* * * * *

UNITED STATES PATENT AND TRADEMARK OFFICE
CERTIFICATE OF CORRECTION

PATENT NO. : 4,459,549

DATED : July 10, 1984

INVENTOR(S) : Seiichi Iwasa et al.

It is certified that error appears in the above-identified patent and that said Letters Patent is hereby corrected as shown below:

Col. 4, line 27, "o" should be --"o"--;
      line 29, "x" should be --"x"--;
      line 36, "x" should be --"x"--;
      line 60, after "current" insert -- value, --.

Col. 5, line 40, "the" should be --the aforementioned--.

Col. 6, line 4, delete "the" (second occurrence).

Col. 9, line 16, "$C_4$and" should be --$C_4$ and--;
      line 34, delete "the".

Col. 16, line 19, "12" should be --12,--.

Signed and Sealed this

Twelfth Day of March 1985

[SEAL]

Attest:

DONALD J. QUIGG

Attesting Officer     Acting Commissioner of Patents and Trademarks